United States Patent [19]
Butler

[11] 4,316,102
[45] Feb. 16, 1982

[54] INPUT STAGE USING JUNCTION FIELD EFFECT TRANSISTORS FOR BIASING

[75] Inventor: James R. Butler, San Jose, Calif.

[73] Assignee: Fairchild Camera and Instrument Corp., Mountain View, Calif.

[21] Appl. No.: 75,435

[22] Filed: Sep. 13, 1979

Related U.S. Application Data

[62] Division of Ser. No. 807,602, Jun. 17, 1977, Pat. No. 4,194,136.

[51] Int. Cl.³ .................... H03K 17/00; H03K 17/687
[52] U.S. Cl. ............................. 307/296 R; 307/571; 307/304
[58] Field of Search ............. 307/296, 279, 304, 571, 307/874; 330/360, 257, 287

[56] References Cited

U.S. PATENT DOCUMENTS

| | | | |
|---|---|---|---|
| 3,732,442 | 5/1973 | Husbands et al. | 307/296 |
| 3,947,778 | 3/1976 | Hsiao et al. | 330/257 |
| 3,961,279 | 6/1976 | Davis | 330/257 |
| 4,194,136 | 3/1980 | Butler | 307/296 |

OTHER PUBLICATIONS

RCA Tech Notes, Hybrid B. Por. and Mos. Flip-Flop Circuits by S. Katz, RCA TN No. 683, 6/66.
IBM Tech. Dsclre. Bulletin, Monolithic Memory Cell with Junction FET Loads, S. Wiedmann, vol. 13, No. 2, 7/70.

Primary Examiner—Stanley D. Miller, Jr.
Assistant Examiner—B. P. Davis
Attorney, Agent, or Firm—Paul J. Winters; Michael J. Pollock; Warren M. Becker

[57] ABSTRACT

In a bias circuit including at least a pair of bipolar transistors interconnected to function as active loads, two junction field effect transistors are interconnected such that the source of one transistor is connected to the emitter of the first of the pair of bipolar transistors and the source of the second junction field effect transistor is connected to the emitter of the second of said bipolar transistors, and the gate electrodes of the first and second junction field effect transistors are electrically connected to each other and to the drain electrodes of both the first and second junction field effect transistors. Alternatively, the drain electrodes of the first and second junction field effect transistors are connected to a common bus and the gate electrodes are connected to a low impedance node.

2 Claims, 2 Drawing Figures

INPUT STAGE USING JUNCTION FIELD EFFECT TRANSISTORS FOR BIASING

This is a division of application Ser. No. 807,602, filed June 17, 1977, now U.S. Pat. No. 4,194,136, issued Mar. 18, 1980.

BACKGROUND OF THE INVENTION

1. Field of the Invention

This invention relates to a new and improved circuit configuration for use in bias circuits of input stages suitable for use, for example, in operational amplifiers.

2. Prior Art

The use of junction field effect transistors (JFET'S) as input devices for operational amplifiers is well established, and the advantages are well known. For example, FIG. 1 shows JFET's J1 and J2 connected in a manner common to the prior art. It is also well known that many integrated circuit operational amplifiers using JFET's as input devices exhibit excessive input voltage offset ($V_{os}$), noise, and drift characteristics due to contributions of the bipolar transistor active loads.

SUMMARY OF THE INVENTION

This invention overcomes the disadvantages of the prior art by using an additional pair of JFET's (corresponding to JFET's J3 and J4 in FIG. 1) in the input stage to reduce the transconductance (denoted as $g_m$ which is defined as $dI_{out}/dV_{in}$) of the bipolar transistor active loads Q6 and Q7 attached to the JFET input devices J1 and J2 which in turn reduce the $V_{os}$, noise, and drift contribution of the bipolar transistor active loads while maintaining the advantages of the JFET input devices J1 and J2 (i.e. low input bias currents, high slew rates and low current noise.)

DETAILED DESCRIPTION

The circuit described in this section uses a new biasing connection which has certain advantages when using junction field effect transistors in the input stages of operational amplifiers and other circuits.

Figure 1:
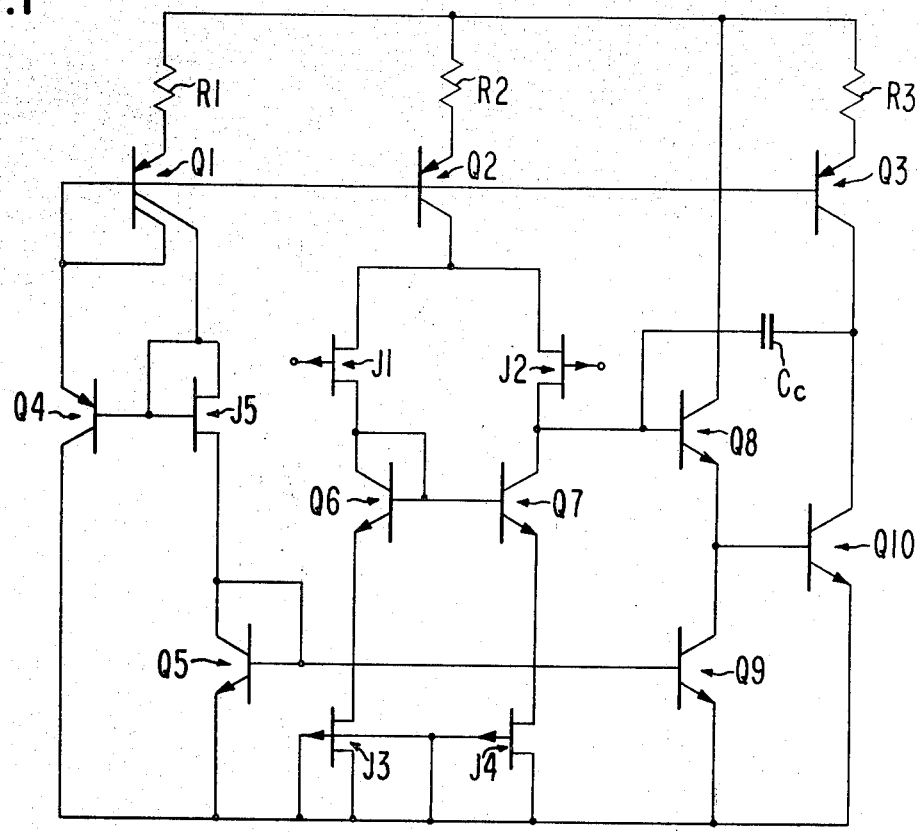
FIG. 1 shows the bias circuitry of this invention.

The circuit of a complete input section for an operational amplifier using this new approach is shown in the circuit diagram of FIG. 1. The input to the amplifier would be applied differentially to the gates of JFET's J1 and J2 and subsequently level shifted via the drains of JFET's J1 and J2 to the current-mirror consisting of bipolar transistors Q6 and Q7. The unique biasing arrangement which is the subject of this invention consists of the conventional bipolar current-mirror transistors Q6 and Q7 in combination with the FET "resistors" J3 and J4. Items J3 and J4 are junction field effect transistors similar to JFET's J1 and J2 except that, unlike the usual current source configuration, they have their gates shorted to their drains or another low impedance node such as a voltage source. The other transistors and JFET J5 shown in the circuit are used in the biasing of the circuit and to ensure stable operation with low temperature coefficient of input offset voltage as shown in the following detailed description of the circuit operation.

Using the following design values:

$I_{Dss}(J5) = 40$ microamps
$I_{Dss}(J1) = I_{Dss}(J2) = 80$ microamps
$I_{Dss}(J3) = I_{Dss}(J4) = 60$ microamps
$V_P = 0.8$ volts where $I_{Dss}$ stands for the drain current with gate and source shorted together and $V_p$ is the voltage required to pinch the JFET channel to the point where no further increase in current results from an increase in voltage.

JFET J5, in connection with transistors Q4 and Q1, biases transistor Q2 at $2I_{Dss}$ of JFET J5. This current divides equally between JFET's J1 and J2. For a balanced input, $I_D$ (drain current) of JFET's J1 and J2 equals $I_{Dss}$ of JFET J5 and the small signal transconductance $g_m = (2I_{Dss}/V_P)\sqrt{I_D/I_{Dss}} = 141$ micromhos. To establish a 4 megacycle unity gain bandwidth, the capacitance of compensating capacitor $C_c = g_m/2\pi f = 5.6$ picofarads, thus establishing a maximum slew rate of 14.3 volts/microsecond. To maintain a balanced input, the base current of transistor Q8 must equal the base current of transistor Q6 plus the base current of transistor Q7. This is accomplished by operating the collector current of transistor Q8 equal to the collector current of transistor Q2.

The use of bipolar current mirror loads for the FET input results in input referred offset voltage, noise and drift in the ratio of $g_m(BP)/g_m(FET)$ times the bipolar offset, noise, and drift (where "BP" denotes the bipolar transistor and "FET" the junction field effect transistor.)

This input referred voltage offset, noise and drift can be reduced by the use of emitter degeneration to reduce the effective transconductance of the bipolar devices Q6 and Q7. The problem then is to provide emitter degeneration that has excellent matching and provides clamping, (to prevent saturation of transistor Q7 during maximum slew rate).

The poor matching typical of base diffused resistors makes them a poor choice. The excellent matching of ion implanted JFET's is desirable but if connected as a current source (i.e., gate connected to source) large devices would be required to prevent saturation of transistor Q7 during maximum slew rate. Furthermore, these large devices would not provide the desired degeneration.

I have discovered that connecting the JFET gate to drain (or other low impedance node) as shown on the circuit diagram with respect to JFET's J3 and J4 allows the use of JFET's for degeneration while maintaining excellent matching. This connection also allows the use of smaller devices and provide automatic clamping.

The input referred offset voltage, noise, and drift due to transistors Q6 and Q7 reduces to $$\cfrac{1}{\cfrac{2I_{Dss}(J1)}{V_P}\sqrt{\cfrac{I_D(J1)}{I_{Dss}(J1)}}\left[\cfrac{kT}{qI} + \cfrac{1}{g_m(J3)}\right]}$$

Figure 2:
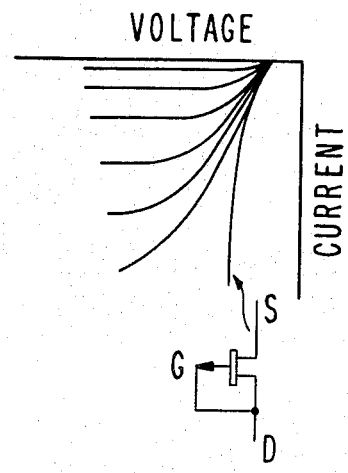
FIG. 2 shows a curve-tracer plot of the characteristics of one of the JFET's of this invention.

An additional advantage of this invention is that JFET's J3 and J4 each provide an inherent clamping effect as normal diode action starts to dominate at approximately 500 millivolts. FIG. 2 clearly shows this by the curve which becomes substantially vertical (i.e. constant voltage) as current increases.

What I claim is:
1. A bias circuit comprising:

at least a pair of bipolar transistors, the bases of said pair of bipolar transistors being connected to each other;

a first junction field effect transistor, the source of which is connected to the emitter of one of said pair of bipolar transistors; and a second junction field effect transistor, the source of which is connected to the emitter of the other of said pair of bipolar transistors;

wherein the gate electrodes of said first and second junction field effect transistors are connected to a low impedance node and the drain electrodes of said first and second junction field effect transistors are connected to a common bus.

2. A bias circuit comprising:

load means comprising a pair of bipolar transistors, each having an emitter, a base, and a collector, the bases connected to each other; and a pair of junction field effect transistors, each having a source, a gate electrode, and a drain, one of the sources connected to one of the emitters, the other of the sources connected to the other of the emitters, the gate electrodes connected to a low impedance node, and the drains connected to a common bus.

* * * * *